United States Patent [19]

Nelson et al.

[11] Patent Number: 4,846,918

[45] Date of Patent: Jul. 11, 1989

[54] COPPER ETCHING PROCESS AND PRODUCT WITH CONTROLLED NITROUS ACID REACTION

[75] Inventors: Norvell J. Nelson, Palo Alto; Phillip A. Martens, Fremont, both of Calif.

[73] Assignee: Psi Star, Fremont, Calif.

[21] Appl. No.: 159,727

[22] Filed: Feb. 24, 1988

[51] Int. Cl.$^4$ .............................................. C23F 1/00
[52] U.S. Cl. .................................. 156/628; 156/666; 156/901
[58] Field of Search .................... 134/3; 156/628, 635, 156/656, 666, 901, 902

[56] References Cited

U.S. PATENT DOCUMENTS

| | | | |
|---|---|---|---|
| 3,853,716 | 12/1974 | Yates et al. | 204/28 |
| 3,857,681 | 12/1974 | Yates et al. | 29/195 |
| 3,896,256 | 7/1975 | Wolski | 428/457 |
| 3,918,926 | 11/1975 | Wolski et al. | 29/195 |
| 3,931,030 | 1/1976 | Ohno | 252/79.4 |
| 3,998,601 | 12/1976 | Yates et al. | 29/195 |
| 4,046,620 | 9/1977 | Andrascek et al. | 156/901 |
| 4,138,470 | 2/1979 | Bolme | 423/390 |
| 4,695,348 | 9/1987 | Battey et al. | 156/647 |
| 4,713,144 | 12/1987 | Schiller | 156/656 |
| 4,767,661 | 8/1988 | Battey et al. | 156/647 |
| 4,767,662 | 8/1988 | Battey et al. | 156/647 |

FOREIGN PATENT DOCUMENTS

| | | |
|---|---|---|
| 0136855 | 7/1984 | Poland . . |
| 1458260 | 12/1976 | United Kingdom . |
| 1462001 | 1/1977 | United Kingdom . |

*Primary Examiner*—David L. Lacey
*Assistant Examiner*—L. Johnson
*Attorney, Agent, or Firm*—Flehr, Hohbach, Test, Albritton & Herbert

[57] ABSTRACT

Copper etching process and product in which a material which promotes the formation of nitrous acid is included in the copper. The copper is etched in a nitric acid solution, and the nitrous acid catalyzes the reaction between the nitric acid and the copper. The catalyst promoter is distributed within the copper to control where the nitrous acid is formed and, hence, the manner in which the copper is etched. In one disclosed embodiment, the material which promotes the formation of nitrous acid increases in concentration toward the substrate, or board to which the copper is bonded. The nitrous acid reacts vigorously with the copper, and the etch rate increases as the etch progresses through the copper toward the substrate. A polymer and/or a nitrous acid scavenger can be included in the etching solution to confine the etching reaction to the region in which the nitrous acid is formed.

14 Claims, No Drawings

COPPER ETCHING PROCESS AND PRODUCT WITH CONTROLLED NITROUS ACID REACTION

This invention pertains generally to the etching of copper, and more particularly to a process and product which are particularly suitable for use in the manufacture of printed circuit boards.

In the manufacture of printed circuit boards, a conductive layer of copper is laminated to an insulative substrate such as a fiberglass-epoxy board, and portions of the copper are etched away to leave the desired circuit patterns. The areas to be left are generally defined by a mask of etch resistant material which is applied to the board prior to etching, then stripped away upon completion of the etching process.

One problem commonly encountered in the etching process is the tendency of the copper to etch laterally under the resist material at the same time that it is being removed vertically. The ratio of vertical etching to lateral etching is commonly referred to as the etch ratio. If the etch ratio is 1:1, the etch is said to be isotropic, and if it is greater than 1:1, the etch is said to be anisotropic.

U.S. Pat. No. 4,497,687 describes an improved process for anisotropically etching copper foil in the manufacture of printed circuit boards. This process utilizes an aqueous solution of nitric acid as an etchant, and it overcomes many of the problems of the other etching processes of the prior art. U.S. Pat. No. 4,545,850 discloses a somewhat similar process in which the etching solution is regenerated by adding sulfuric acid. Even with these improved processes, some instances have been encountered in which there has been inexplicable lateral etching or undercutting of the copper.

It is in general an object of the invention to provide a new and improved copper etching process and product in which lateral etching or undercutting is reduced substantially.

Another object of the invention is to provide an etching process and product of the above character in which anisotropic etching is achieved consistently.

These and other objects are achieved in accordance with the invention by etching the copper in a nitric acid solution and by including in the copper a material which promotes the formation of nitrous acid which catalyzes a reaction between the nitric acid and the copper to dissolve the copper. The catalyst precursor material is distributed within the copper to control the removal of the copper, and in one disclosed embodiment it increases in concentration toward the substrate, or board, to which the copper is bonded so that the etch rate increases as the etch progresses through the copper toward the substrate. A polymer and/or a nitrous acid scavenger can be included in the etching solution to confine the etching reaction to the region in which the nitrous acid is formed.

In the nitric acid etching chemistry disclosed in U.S. Pat. Nos. 4,497,687 and 4,545,850, nitric acid reacts with copper according to the relationship $$3Cu + 8HNO_3 = 3Cu(NO_3)_2 + 2NO + 4H_2O$$

with the nitric acid serving both as an oxidant and as an anion source for the dissolved copper. The dissolved copper is removed by adding sulfuric acid to precipitate the copper according to the relationship $$3Cu(NO_3)_2 + 3H_2SO_4 = 3CuSO_4 + 6HNO_3.$$

To protect the etch resist and the substrate board from attack by the nitric acid, either copper nitrate or sulfuric acid is included in the etching solution. When sulfuric acid is employed, the consumption of nitric acid is reduced, and the reaction proceeds according to the relationship $$3Cu + 2HNO_3 + 3H_2SO_4 = 3CuSO_4 + 2NO + 4H_2O.$$

Copper is removed as the sulfate pentahydrate according to the relationship $$CuSO_4 + 5H_2O = CuSO_4 \cdot 5H_2O.$$

The copper nitrate or sulfuric acid increases the reactivity of nitric acid toward copper such that reasonable reaction rates can be achieved with much lower concentrations of nitric acid than would otherwise be required. Thus, the amount of nitric acid can be kept to levels which do not react with the substrates or organic resists. Certain metal resists can also be utilized with these etchants, including tin, nickel and alloys thereof.

A polymer is included in the etching solution to control the surface reaction rate and to enhance the anisotropy of the etch. One suitable polymer is a polyacrylamide which is soluble in water and has a high molecular weight. The amount of polymer employed is on the order of 0.05% (volume) of the solution. Suitable polyacrylamides include Hercules Reten 520 (a neutral polyacrylamide having a high molecular weight), and American Cyanamid's Magnifloc 2535 CH polyacrylamide.

A surfactant can also be included in the etching solution to reduce surface tension and facilitate the movement of nitric oxide bubbles from the surface of the copper. The nitric oxide gas is generated during the etching process, and the surfactants serve to keep the bubble size small and prevent the bubbles from bridging between resist lines and blocking etching between the lines. Only a very small amount of surfactant is required, e.g. 0.1 to 0.2% (volume) of the etching solution. Suitable surfactants include fluorocarbon surfactants such as 3M's FC-100 (an amphoteric surfactant) and FC-135 (a cationic surfactant). In some processes such as spray etching, the surfactant may not be necessary and can even impede the etching process.

The reaction between copper and nitric acid is catalyzed by nitrous acid. Even though copper will not react with pure nitric acid at any concentration, once even a small amount of nitrous acid is introduced, a vigorous reaction commences between the nitric acid and the copper. One of the products of this reaction is more nitrous acid, and once initiated, the reaction tends to support itself, accelerating as it does so. Thus, the reaction between copper and nitric acid is autocatalytic with respect to nitrous acid.

It has now been found that the character of the etch can be controlled and anisotropy can be improved substantially by including in the copper a material which promotes the formation of nitrous acid and by including a polymer and/or a nitrous acid scavenger in the etching solution to control the nitrous acid which is formed.

Since nitric acid itself does not react with copper, and the use of a nitric acid solution depends upon the presence of the catalyst nitrous acid to dissolve the copper, by controlling where the nitrous acid is formed and where it is available for interaction with the copper, it is possible to control the manner in which the copper is removed.

For anisotropic etching on a printed circuit board, the material which promotes the formation of nitrous acid is distributed nonuniformly within the copper with a gradient such that the material has a relatively high concentration near the substrate, or board, and a relatively low concentration toward the outer surface of the copper. The concentration gradient can be formed, for example, in a copper layer formed by electroplating by decreasing the ratio of the catalyst promoter material to the copper as the plating progresses. It can also be formed by depositing the catalyst promoter material on a surface of the copper and diffusing it into the copper, or by any other suitable technique.

Suitable catalyst promoter materials include copper alloying metals such as zinc, tin, cadmium, magnesium, aluminum, the alkali metals (lithium, sodium, potassium, rubidium and cesium) and, to some extent, iron and lead. These metals do not require the presence of nitrous acid to react with nitric acid, and upon such reaction they either produce nitrous acid directly or a precursor to nitrous acid.

A polymer having a high molecular weight and an affinity for copper can be added to the etching solution to minimize diffusion of nitrous acid from the bottom surface of the etched region toward the top of the sidewall. Polyacrylamide and derivatives of it have been found to be suitable for this purpose. The polymer forms a thin adsorption layer on the copper during the etching process. This layer inhibits diffusion of the nitrous acid along the surface of the copper, but has relatively little effect on the exchange of reactants and products between the copper and the bulk of the etchant. Thus, nitrous acid generated in a particular region is likely to react with copper in the same region or diffuse into the bulk of the etchant and be diluted. It is less likely to diffuse along the copper surface and react with copper in a distant region.

A nitrous acid scavenger can be added to the etching solution to deplete the nitrous acid away from the interface between the solution and the copper. By controlling the concentration of the nitrous acid in this manner, the etching reaction is controlled, and copper is removed only at the interface where the catalyst promoter is present and the nitrous acid is generated. Suitable scavengers include urea, hydrogen peroxide, hydrazine, sulfamic acid, and combinations thereof.

It has been found that one particularly satisfactory and commercially availble source of copper for use in the invention is a 9 micron copper foil grown on an aluminum carrier foil by Gould, Inc. Prior to deposition of the copper, the aluminum is given a zincating treatment, which serves to overcome a chemical incompatibility which prevents the copper from being electrodeposited directly on the aluminum. Although the zinc coating is substantially removed, enough of the zinc remains to be effective as an interface for copper deposition. After the copper has been deposited, a thin layer of electroplated zinc is formed on the exposed surface to the copper to protect it. The thickness of the electroplated layer is much greater than the zinc which remains at the interface between the copper and the aluminum.

The copper foil thus formed is then laminated to a standard epoxy-fiberglass substrate, and the aluminum foil is removed from the outer surface of the copper. The temperature and pressure conditions employed in the lamination process cause the copper and zinc to alloy and form a brass. Some of zinc layer diffuses into the copper foil, giving the foil a zinc gradient which decreases in concentration from the substrate toward the outer surface of the copper. The relatively small amount of zinc remaining from the first zincating step has a negligible effect on the zinc gradient.

Another 9 micron copper foil grown on an aluminum carrier is available commercially from Metallverken Foils AB, Perstorp, Sweden. This foil is similar to the Gould 9 micron foil in that the copper is grown on an aluminum carrier foil with a zincate layer on the aluminum. It differs from the Gould foil in that the zincate layer is not removed before the copper is deposited, and the exposed surface of the copper foil is protected by a chromate deposit rather than zinc. When this foil is laminated to a substrate board, any alloying of copper and zinc occurs at the aluminum-copper interface, not at the copper-substrate interface. The gradient produced by diffusion of the zinc into the copper is reversed, and the higher zinc concentration is at the outer surface of the copper, not toward the substrate. When this board is etched in a nitric acid solution, the etch is isotropic.

A board with the Metallverken foil can be etched anisotropically by forming a thin layer of a suitable material such as zinc on the substrate side of the copper foil before it is laminated to the substrate. The zinc from this layer will diffuse into the copper as it does in the Gould foil, producing the desired gradient.

When a board having either the Gould foil or the Metallverken foil with a layer of zinc on the substrate side of the copper is etched in a nitric acid solution, the etch is anisotropic because the etch rate increases as the dissolution of copper proceeds toward the substrate due to the increasing production of nitrous acid initiated by the zinc. The vertical etching reaction is thus catalyzed relative to the lateral reaction due to an increase in the reaction catalyst as a function of the depth of the etch. Enhancement of the anisotropy is observed when a nitrous acid scavenger, such as urea, is added to the etching solution. The scavenger depletes the bulk nitrous acid concentration so that the reaction between the copper and the nitric acid can occur only in the presence of the zinc which generates the necessary catalytic amounts of nitrous acid at the interface between the etchant and the reacting surface of the copper.

A circuit board manufactured in accordance with the invention has a layer of copper on a substrate such as a fiberglass-epoxy board, with a catalyst precursor material which reacts with nitric acid to form nitrous acid distributed within the copper to control the manner in which the copper is removed by a nitric acid etchant. In one preferred embodiment, the precursor is distributed with a higher concentration toward the substrate than toward the outer surface of the copper so that the etch rate will increase toward the substrate when the board is etched in a nitric acid solution.

This results in an etch which is substantially more anisotropic than it would be without the catalyst precursor gradient.

It is apparent from the foregoing that a new and improved copper etching process and product have been provided for use in the manufacture of printed circuit boards. While only certain presently preferred embodiments have been described in detail, as will be apparent to those familiar with the art, certain changes and improvements can be made without departing from the scope of the invention as defined by the following claims.

We claim:

1. In a process for manufacturing a printed circuit board in which copper is removed by etching in a nitric acid solution, the steps of: providing a substrate with a layer of copper having a nonuniform distribution of catalyst precursor material within the copper for promoting the formation of nitrous acid from nitric acid in a controlled manner, forming an etch resist mask over the copper with a portion of the copper being exposed through the mask, and contacting the exposed portion of the copper with the nitric acid solution to bring about the formation of nitrous acid and the removal of copper in accordance with the distribution of the catalyst precursor material within the copper.

2. The process of claim 1 wherein the catalyst precursor material decreases in concentration from the substrate toward the outer surface of the copper layer.

3. The process of claim 1 wherein the catalyst precursor material is selected from the group consisting of zinc, tin, cadmium, magnesium, aluminum, and alkali metal, iron, lead, and combinations thereof.

4. The process of claim 1 wherein the nitric acid solution contains a nitrous acid scavenger which depletes the nitrous acid concentration away from the interface between the solution and the copper.

5. The process of claim 4 wherein the nitrous acid scavenger is selected from the group consisting of urea, hydrogen peroxide, hydrazine, sulfamic acid, and combinations thereof.

6. The process of claim 1 wherein the nitric acid solution contains a polymer which forms an adsorption layer on the copper during etching to inhibit diffusion of the nitrous acid along the copper.

7. The process of claim 6 wherein the polymer is selected from the group consisting of polyacrylamide and derivatives thereof.

8. The process of claim 1 wherein the nitric acid solution contains a polymer which has a high molecular weight and an affinity for copper.

9. The process of claim 1 wherein the nitric acid solution is an aqueous solution which contains nitric acid, copper nitrate or sulfuric acid, and a polymer.

10. The process of claim 9 wherein the nitric acid solution also contains a surfactant.

11. The process of claim 1 including the step of adding sulfuric acid to the solution after some of the copper has been dissolved to convert copper nitrate formed by the dissolution of the copper to nitric acid and a copper precipitate.

12. In a process for manufacturing a printed circuit board, the steps of: providing a substrate with a layer of copper on one side thereof, said layer of copper having a nonuniform distribution of catalyst precursor material therein for promoting the formation of nitrous acid from nitric acid in a controlled manner, and exposing the copper to a nitric acid etching solution to bring about the formation of nitrous acid and the removal of copper in accordance with the distribution of the catalyst precursor material within the copper.

13. The process of claim 12 wherein the catalyst precursor material decreases in concentration from the substrate toward the outer surface of the layer of copper.

14. The process of claim 12 wherein the catalyst precursor material is selected from the group consisting of zinc, tin, cadmium, magnesium, aluminum, an alkali metal, iron, lead, and combinations thereof.

* * * * *